(12) United States Patent
Rencher (10) Patent No.: US 11,782,715 B2
(45) Date of Patent: Oct. 10, 2023

(54) METHODS AND APPARATUS FOR REORDERING SIGNALS

(71) Applicant: SEMICONDUCTOR COMPONENTS INDUSTRIES, LLC, Phoenix, AZ (US)

(72) Inventor: Michael Alvin Rencher, Corvallis, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 464 days.

(21) Appl. No.: 17/248,346

(22) Filed: Jan. 21, 2021

(65) Prior Publication Data

US 2022/0229665 A1 Jul. 21, 2022

(51) Int. Cl.
  *G06F 9/30* (2018.01)
  *G06F 9/448* (2018.01)
  *H03K 19/17704* (2020.01)
  *H03K 19/0185* (2006.01)
  *G06F 9/54* (2006.01)
  *G06F 7/76* (2006.01)

(52) U.S. Cl.
  CPC .......... *G06F 9/30101* (2013.01); *G06F 7/76* (2013.01); *G06F 9/4498* (2018.02); *G06F 9/544* (2013.01); *H03K 19/01855* (2013.01); *H03K 19/17704* (2013.01)

(58) Field of Classification Search
  CPC ...... G06F 9/30101; G06F 7/76; G06F 9/4498; G06F 9/544; H03K 19/01855; H03K 19/17704; Y02D 10/00
  See application file for complete search history.

(56) References Cited

U.S. PATENT DOCUMENTS

| | | | | |
|---|---|---|---|---|
| 10,061,537 B2 * | 8/2018 | Kersh | ...................... | G06F 3/065 |
| 10,108,376 B1 * | 10/2018 | Zeng | ................... | G06F 11/1048 |
| 2005/0235182 A1 | 11/2005 | Lee et al. | | |
| 2021/0382686 A1 * | 12/2021 | Pfister | ....................... | G06F 7/76 |

FOREIGN PATENT DOCUMENTS

| | | | | |
|---|---|---|---|---|
| EP | 1237285 A2 * | 9/2002 | .......... | H03M 13/235 |
| WO | 2016105783 A1 | 6/2016 | | |

* cited by examiner

*Primary Examiner* — Farley Abad
(74) *Attorney, Agent, or Firm* — Dickinson Wright PLLC (57) ABSTRACT

Various embodiments of the present technology may provide methods and apparatus for reordering signals that are generated by a sensor. The apparatus may receive the generated signals in the form of a plurality of X-bit input signals and generate a plurality of output signals according to an exemplary reordering scheme. The apparatus may perform the exemplary reordering scheme based on one or more states of a state machine.

20 Claims, 4 Drawing Sheets

METHODS AND APPARATUS FOR REORDERING SIGNALS

BACKGROUND OF THE TECHNOLOGY

Electronic devices include many on-chip and off-chip circuit components coupled by interconnects (e.g., a sensor coupled to a computer processor). Such interconnects, which include wires, have interfaces that are designed to allow multi-bit signals to be transferred between the circuit components. One problem with transferring signals via an interface is that doing so can result in a substantial number of bit toggles (i.e., interface channel switchings from 0 to 1 or from 1 to 0). High toggle counts increase the dynamic energy consumed by both on-chip and off-chip circuit components and their interconnects due to more frequent charging and discharging of the wires.

In addition, electronic devices and their interconnects are shrinking due to the advancement of technologies. However, capacitances of interconnects are increasing due to minimized wire size and inter wire spacing. As a result, interconnect power consumption and circuit component power consumption is increasing significantly, which is affecting overall performance of the electronic devices.

Lower power consumption is important in order to achieve improved device performance and energy efficiency, particularly given the fact that many modern electronic devices, which continue to shrink in size, are used in data-intensive applications.

While conventional methods for reducing power consumption in electronic devices involve physically reconstructing interconnects or employing various techniques such as shielding, skewing, and encoding, they have not sufficiently addressed the need to reduce power consumption by reducing toggle counts owing to the increased sophistication and complexity of modern electronic devices.

SUMMARY OF THE TECHNOLOGY

Various embodiments of the present technology may provide methods and apparatus for reordering signals that are generated by a sensor. The apparatus may receive the generated signals in the form of a plurality of X-bit input signals and generate a plurality of output signals according to a reordering scheme. The apparatus may perform the reordering scheme based on one or more states of a state machine.

BRIEF DESCRIPTION OF THE DRAWINGS

A more complete understanding of the present technology may be derived by referring to the detailed description and claims when considered in connection with the following illustrative figures. In the following figures, like reference numbers refer to similar elements and steps throughout the figures.

DETAILED DESCRIPTION OF EXEMPLARY EMBODIMENTS

The present technology may be described herein in terms of functional block components and various processing steps. Such functional blocks may be realized by any number of hardware or software components configured to perform the specified functions and achieve the various results. For example, the present technology may employ various sensors, interconnects, interfaces, buffers, registers, logic circuitry, state machines, timers, and the like, which may carry out a variety of functions. In addition, the present technology may be practiced in conjunction with any number of sensors, and the system described is merely one exemplary application for the technology.

Methods and apparatus for reordering signals according to various aspects of the present technology may operate in conjunction with any system configured to provide communication between circuit components. In addition, the apparatus may operate in conjunction with any suitable power saving system, such as power saving systems used in very large-scale integration (VLSI) applications, power saving systems that employ various encoding techniques such as "scrambling", and the like.

Figure 1:
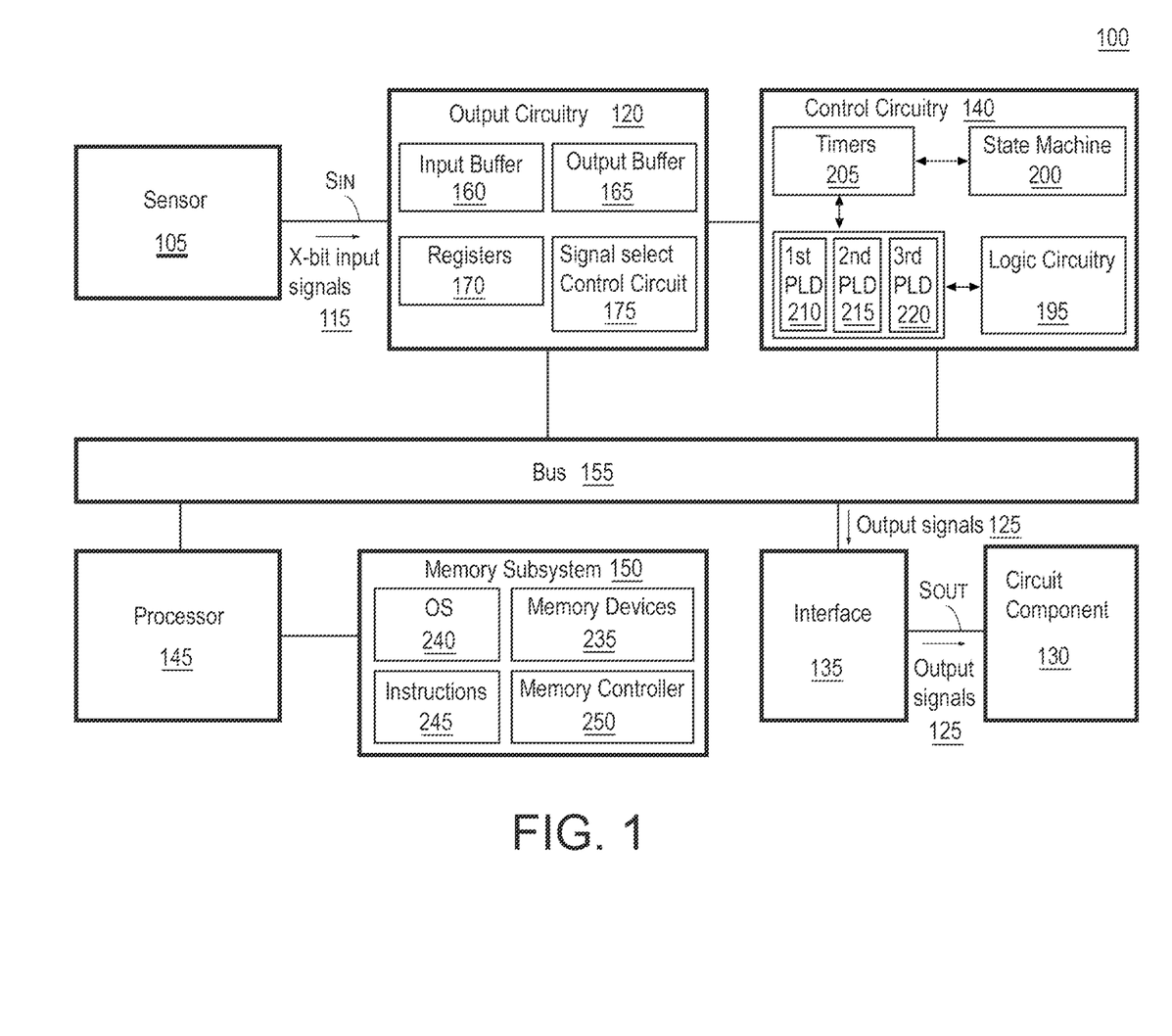
FIG. 1 is a block diagram of a system in accordance with an exemplary embodiment of the present technology.

Referring to FIG. 1, an exemplary system 100 may comprise a sensor 105 configured to generate sensor data and transmit the sensor data, in the form of X-bit input signals 115, to output circuitry 120 for processing. Each X-bit input signal 115 may comprise a plurality of bit subsets, where each bit subset comprises fewer than X bits. The output circuitry 120 may be configured to receive the X-bit input signals 115 transmitted by the sensor 105 and generate a plurality of output signals 125 from the plurality of X-bit input signals 115 according to a reordering scheme. The output circuitry 120 may be further configured to transmit the output signals 125 to a circuit component 130, such as a receiver, via an interface 135.

The system 100 may also comprise control circuitry 140 configured to controllably operate the output circuitry 120 by sending the output circuitry 120 into one or more states in response to detecting the X-bit input signals 115 being received by the output circuitry 120. The control circuitry 140 may be further configured to perform the reordering scheme by controlling the state of the output circuitry 120.

The system 100 may further comprise a processor 145 configured to perform the processing operations of the system 100 and a memory subsystem 150, which represents the main memory of system 100, configured to provide temporary or permanent storage for code to be executed by the processor 145, or data values to be used in executing the exemplary reordering scheme.

The sensor 105 may generate the sensor data and transmit the sensor data to the output circuitry 120 via a signal input line, $S_{in}$. The signal input line, $S_{in}$, may be configured to transmit the sensor data, in the form of the X-bit input signals 115, from the sensor 105 to the output circuitry 120 for processing. The sensor 105 may comprise any suitable device, module, machine, or subsystem capable of detecting and processing events and/or changes in an external environment, such as a biosensor, a chemical sensor, a sound sensor, and an image sensor including, but not limited to, a Bayer-filter image sensor and a direct digital radiography (DDR) image sensor.

The interface 135 may receive output signals 125 from the output circuitry 120 via a bus 155 or other suitable communication line. The interface 135 may also transmit the output signals 125 to the circuit component 130 via a signal output line, $S_{out}$. The interface 135 may comprise any suitable medium designed to allow the sensor 105 and the circuit component 130 to communicate with each other. It will be appreciated that modifications may be made to the manner in which the sensor 105 and the circuit component 130 communicate with each other. In one embodiment, the sensor 105 and the circuit component 130 may be part of separate packages. In another embodiment, the sensor 105 and the circuit component 130 may be part of separate chips integrated together in a multi-chip package.

In various embodiments, the reordering scheme described in any embodiment herein may be performed for an interface other than the interface 135 coupled to the circuit component 130. For example, the interface 135 may be an input/output (I/O) interface, a network interface, or a peripheral interface. An I/O interface may comprise one or more interface components through which a user interacts with the system 100, while a network interface may provide the system 100 with the ability to communicate with remote devices, such as servers and other electronic devices, over one or more networks. A peripheral interface may comprise any interface not specifically mentioned above, such as a memory bus interface, a processor bus interface, an internet connection, a disk controller, or the like.

Figure 2:
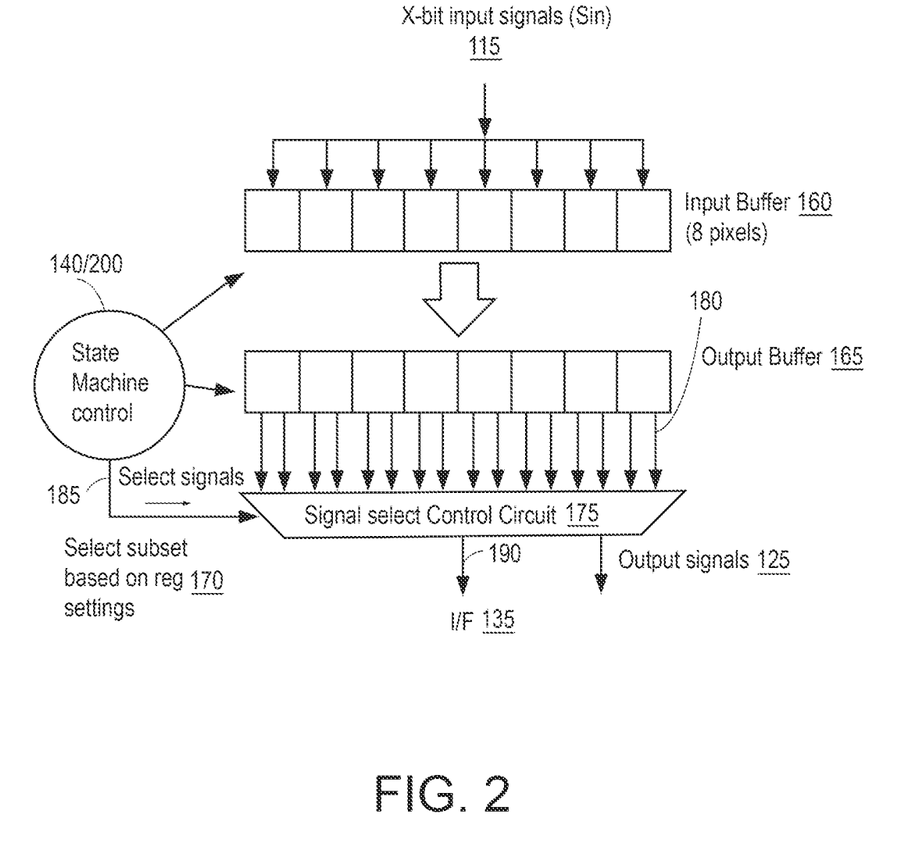
FIG. 2 representatively illustrates output circuitry in accordance with an exemplary embodiment of the present technology.

In an exemplary embodiment, and referring to FIGS. 1 and 2, the output circuitry 120 may comprise an input buffer 160 for receiving and buffering a plurality of X-bit input signals 115 sent from the sensor 105. The output circuitry 120 may also comprise an output buffer 165 for holding a plurality of X-bit input signals 115 while the system 100 is performing the reordering scheme. For example, the input buffer 160 may comprise a plurality of first sections, wherein each first section is configured to hold a single X-bit input signal. Similarly, the output buffer 165 may comprise a plurality of second sections, wherein each second section is configured to hold a single X-bit input signal. The number of sections in each of the input buffer 160 and the output buffer 165 may be selected based on the particular application. An input terminal of the input buffer 160 may be connected to the sensor 105 via the signal input line, $S_{in}$, and an output portion of the input buffer 160 may be connected to an input terminal of the output buffer 165.

The output circuitry 120 may also comprise a plurality of registers 170 that are accessible by the system 100, such as the control circuitry 140. The registers 170 may be programmable and capable of storing different types of data. For instance, each register 170 may store a word to define one of a plurality of states of the output circuitry 120. Each state may be independent from the other states and may be associated with one register 170. Given that each X-bit input signal (115) may comprise a plurality of bit subsets, each word may indicate a bit subset from the plurality of bit subsets. For example, a bit subset may be defined as the four most significant bits of the X-bit input signal, the four least significant bits of the X-bit input signal, and the like. The bit subset may be defined according to the number of bits in the X-bit input signal. Each word may be moved between the memory subsystem 150 and its corresponding register 170 depending on the entity or entities that are currently executing on the processor 145. The registers 170 may be configured to allow rapid access by the system 100 (e.g., by the processor 145) and may be of any desired size, such as 8-bit registers, 16-bit registers, 32-bit registers, 36-bit registers, 64-bit registers, or the like.

In one embodiment, at least one of the registers 170 may be a programmable register that is "static", where the word stored in the register 170 does not change during an iteration of a program loop executed by the processor 145 when the system 100 is performing the reordering scheme. In another embodiment, at least one of the registers 170 may be a programmable register that is "dynamic", where the register is capable of storing a new word at a predetermined synchronization point. The predetermined synchronization point may be when the system 100 is operating in an initialization state, in an inactive state, or any other predetermined state.

The output circuitry 120 may further comprise a signal select control circuit 175 connected to the output terminal of the output buffer 165 via input lines 180. The input lines 180 may be configured to transmit the X-bit input signals 115 from the output buffer 165 to the signal select control circuit 175. The signal select control circuit 175 may also be connected to the control circuitry 140 via select lines 185. The select lines 185 may be configured to transmit the select signals from the control circuitry 140 to the signal select control circuit 175. The signal select control circuit 175 may be configured to receive and respond to the select signals sent from the control circuitry 140. For instance, in response to receiving one of the select signals from the control circuitry 140, the signal select control circuit 175 may be configured to select, from the plurality of bit subsets, the bit subset of the X-bit input signal according to the select signal. The signal select control circuit 175 may be further connected to the interface 135 via an output line 190. The output line 190 may be configured to transmit the output signals 125 from the signal select control circuit 175 to the interface 135. In various embodiments, the signal select control circuit 175 may comprise a multiplexer or any other circuit or system suitable for selecting between several input signals and transmitting the selected signal to the output line 190.

The control circuitry 140 may control the operation of the input buffer 160, the output buffer 165, and the signal select control circuit 175. The control circuitry 140 may be connected to the output circuitry 120 via the bus 155. The control circuitry 140 may comprise logic circuitry 195 for receiving various inputs and providing the select signals to the signal select control circuit 175. The control circuitry 140 may also comprise a state machine 200. The state machine 200 may be configured to receive inputs from a timer 205. In an exemplary embodiment, the control circuitry 140, including the functionality of the state machine 200, may be implemented using a variety of different logic components, processors, associated configuration data and/or stored programming instructions.

The control circuitry 140 may further comprise a programmable logic device, such as a first programmable logic device (PLD) 210 and a second programmable logic device (PLD) 215, which are responsive to clock signals sent from the timer 205. In one embodiment, the first PLD 210 may be responsive to the logic circuitry 195 to receive a first word and the second PLD 215 may be responsive to the logic circuitry 195 to receive a second word. The logic circuitry 195 may access the words stored in the registers 170 in response to receiving instructions issued by the processor 145. The control circuitry 140 may also comprise an n-th PLD 220 that is responsive to the logic circuitry 195 to receive an n-th word. Each of the first, second, and n-th PLDs 210, 215, and 220 may be configured to generate a respective one of the select signals having a bit-precision corresponding to a respective word sent from the logic circuitry 195 and related to the clock signal from the timer 205. For instance, each of the first, second, and n-th PLDs 210, 215, and 220 may be configured to count the clock signals and generate its respective control signal having an amplitude that is related to the respective word.

In order to perform the reordering scheme, the control circuitry 140 may be further configured to controllably operate the output circuitry 120 by sending the output circuitry 120 into one or more states, which it may do by selectively transmitting the control signals, i.e., select signals, to the signal select control circuit 175. Each state, which is independent from the other states, may be associated with one select signal.

Figure 3:
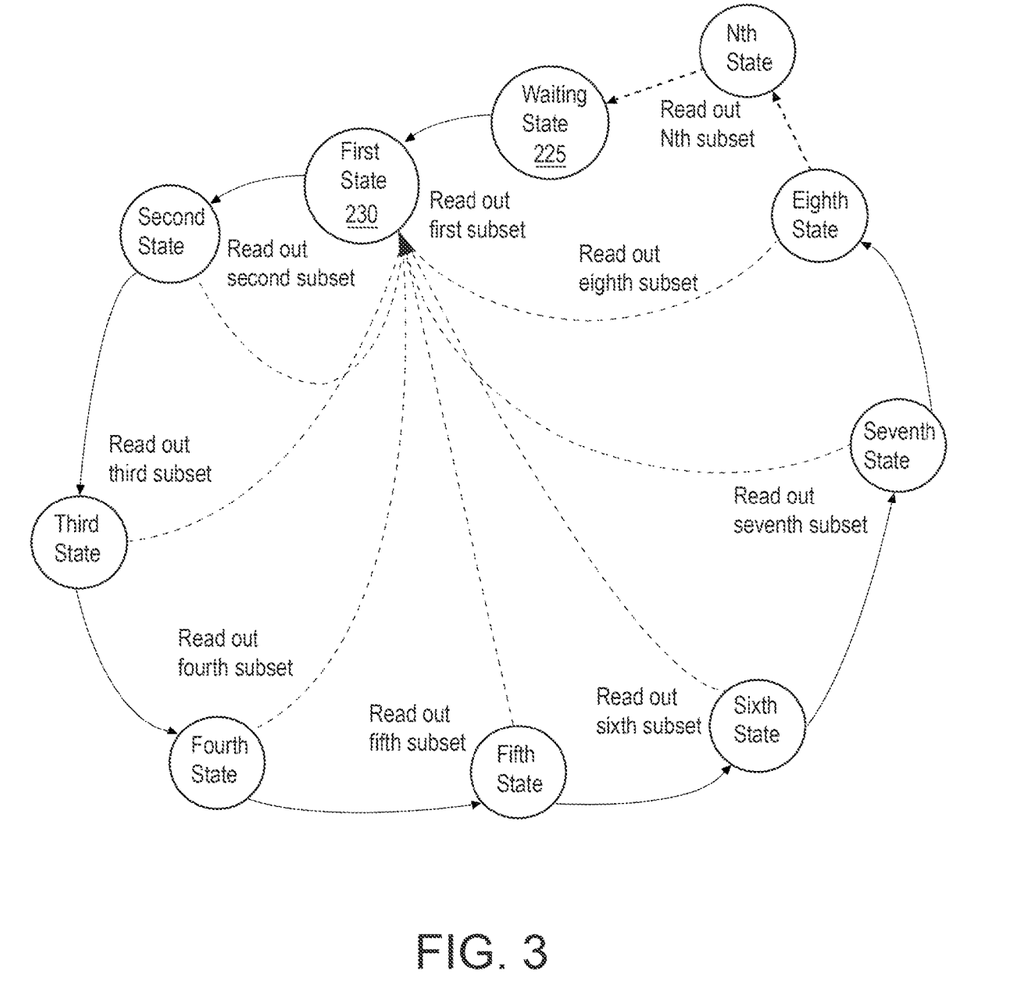
FIG. 3 representatively illustrates a state diagram of a state machine in accordance with an exemplary embodiment of the present technology.

In an exemplary embodiment, the control circuitry 140 may be configured to send the output circuitry 120 into a first state 230 from a waiting state 225 (i.e., an inactive state) in response to detecting receipt of the X-bit input signals 115 by the input buffer 160. In response to detecting receipt of the X-bit input signals 115, the control circuitry 140 may be configured to access a word stored in one of the registers 170, generate a select signal based on the word, and transmit the select signal to the signal select control circuit 175 based on the state of the control circuitry 140. After entering the first state 230, the control circuitry 140 may be further configured to send the output circuitry 120 into a plurality of subsequent states in response to determining that the number of X-bit input signals 115 remaining to be read out of the input buffer 160 exceeds zero. In response to determining that the number of bit subsets from the X-bit input signals 115 remaining to be read out of the input buffer 160 exceeds zero, the control circuitry 140 may be further configured to access a word stored in another register 170, generate a select signal based on the word, transmit the select signal to the signal select control circuit 175, and read out (from the output buffer) the bit subset (of each input signal) that corresponds to the word associated with a particular state.

The memory subsystem 150, which may represent the main memory of the system 100, may be configured to provide temporary storage for code executed by the processor 145, or data values used in executing the reordering scheme. The memory subsystem 150 may comprise one or more suitable memory devices 235 for storing data, instructions, programs, or other items, such as read-only memory (ROM), flash memory, one or more varieties of random access memory (RAM), or other memory devices, or a combination of such devices. The memory subsystem 150 may be configured to store and host, among other things, an operating system (OS) 240 to provide a software platform for execution of instructions 245 in the system 100. Additionally, other instructions may be stored and executed from the memory subsystem 150 to provide the logic and the processing of the system 100. The memory subsystem 150 may further comprise a memory controller 250 configured to generate and issue commands to the one or more of the memory devices 235. The memory subsystem as described herein may be compatible with any suitable memory technology, such as dual data rate version 3 (DDR3), DDR version 4 (DDR4), low power DDR version 3 (LPDDR3), low power double data rate version 4 (LPDDR4), Wide I/O 2 (WI02), JESD229-2, high band width memory DRAM (HBM), JESD235, DDR version 5 (DDR5), LPDDR5, wide I/O 3 (WI03), HBM version 2 (HBM2), and/or others, and technologies based on derivatives or extensions of such specifications.

The processor 145 may be configured to perform the primary processing operations of the system 100, including the processing operations associated with performing the reordering scheme. In an exemplary embodiment, the processor 145 may execute an operating platform or an operating system of which applications and/or device functions are executed. For instance, the processor 145 may execute the OS 240. The execution of code and operations by the processor 145 may create requests for data stored in one or more of the memory devices 235. In an exemplary embodiment, the processor 145 may be connected to the memory subsystem 150 via the bus 155. The processor 145 may comprise any suitable processing device, such as microprocessors, application processors, microcontrollers, programmable logic devices, or the like.

The bus 155 may comprise any one or more separate physical buses, communication lines/interfaces, and/or point-to-point connections, which may be connected by appropriate bridges, adapters, and/or controllers. For example, the bus 155 may comprise a peripheral component interconnect (PCI) bus, a HyperTransport or industry standard architecture (ISA) bus, a small computer system interface (SCSI) bus, a universal serial bus (USB), or an institute of Electrical and Electronics Engineers (IEEE) standard 1394 bus.

Referring now to FIGS. 1-4, after a start block 400, at block 405, the system 100 may start performing the reordering scheme in the waiting state 225. In the waiting state 225, the output circuitry 120 may be initialized to a predetermined known state and the X-bit input signals 115 may be sent from the sensor 105 to the input buffer 160 via the signal input line, $S_{in}$. At block 410, the X-bit input signals 115 may be buffered in the input buffer 160. The input buffer 160 may have a predetermined size. For instance, the input buffer 165 may be capable of storing N input signals 115, where each input signal 115 has X bits and N is a natural number greater than one. Once the N input signals 115 have been buffered and the input buffer 160 is full, the N input signals 115 may be transmitted to the output buffer 165 based on the state of the output circuitry 120.

Figure 4:
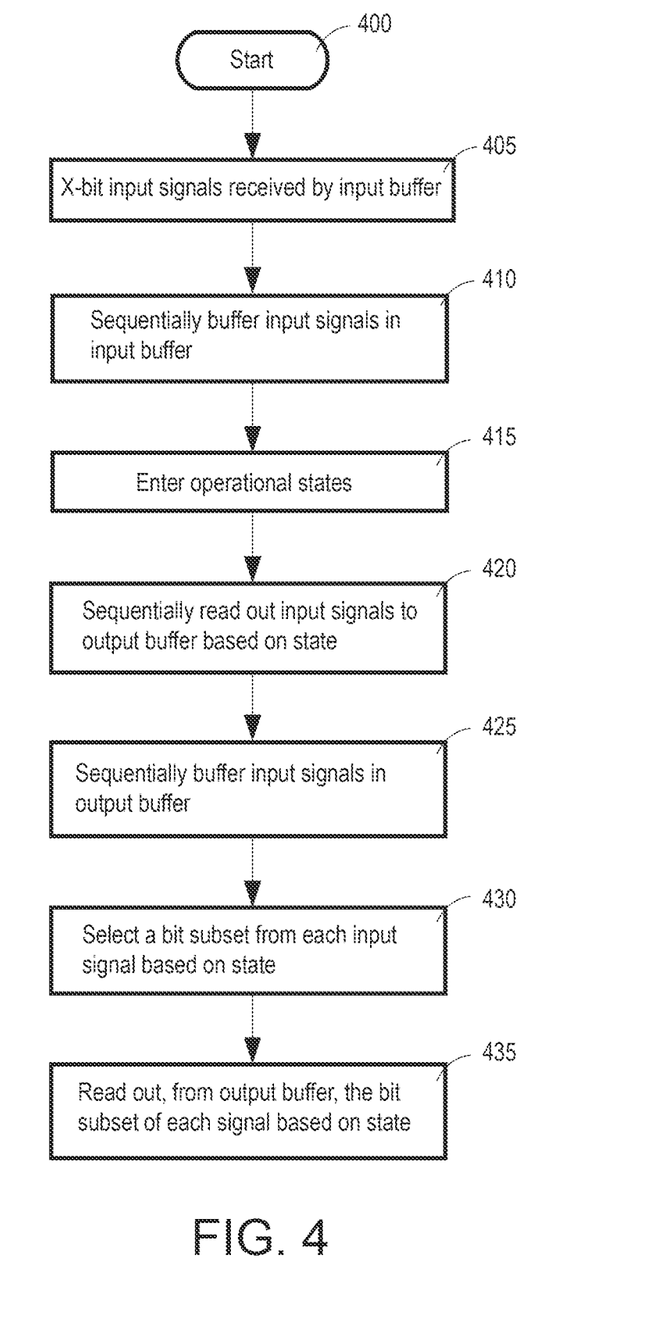
FIG. 4 representatively illustrates a flow diagram for operating the system in accordance with an exemplary embodiment of the present technology.

At block 415, the output circuitry 120 may enter the first state 230 from the waiting state 225 in response to detecting that the N input signals 115 have been received by the input buffer 160 and that the input buffer 160 is full. At block 420, after the output circuitry 120 enters the first state 230, all of the input signals 115 may be read out from the input buffer 160 to the output buffer 165. At block 425, the input signals 115 that were read out from the input buffer 160 may be buffered in the output buffer 165. At block 430, the control circuitry 140 may access a register 170 corresponding to the first state 230 and generate a select signal based on the word stored in the register 170. The control circuitry 140 may then send the select signal to the signal select control circuit 175 via one of the select lines 185. At this point, the signal select control circuit 175 may select the bit subset of each input signal according to the select signal.

At block 435 the selected bit subset from each input signal may then be read out from the output buffer 165 to the interface 135 according to the state of the output circuitry 120. For example, at one state, the output buffer 165 may be directed (via the control circuitry 140 and the signal select control circuit 175, as described above) to read out the 4 most significant bits of a first input signal from the N input signals while the output buffer 165 retains the remaining bits from the first input signal. At a next state, the output buffer 165 may be directed (via the control circuitry 140 and the signal select control circuit 175, as described above) to read out the 4 most significant bits of a second input signal from the N input signals while the output buffer 165 retains the remaining bits from the second input signal. The system 100 may perform a number of subsequent states to read out the first desired bit subset (e.g., the 4 most significant bits) of each input signal from the output buffer 165.

The system 100 may then cycle through a number of subsequent states to read out the remaining bits from the input signals. For example, at a particular state and assuming an 8-bit first input signal, the output buffer 165 may be directed (via the control circuitry 140 and the signal select control circuit 175, as described above) to read out the remaining 4 bits (assuming the first desired bit subset was the 4 most significant bits) of the first input signal. At a next state and assuming an 8-bit first input signal, the output buffer 165 may be directed (via the control circuitry 140 and the signal select control circuit 175, as described above) to read out the remaining 4 bits of the second input signal. The system 100 may perform a number of subsequent states to read out the remaining bits of each input signal from the output buffer 165.

The output buffer 165 may be directed to read out the bit subsets from left to right or in any other desirable order, and the number of states may be based on the number of output buffer sections and the number of bit subsets. For example, in a case with 8 output buffer sections and 2 bit subsets, the system 100 may cycle through 16 states.

While the system 100 is performing the reordering scheme on the X-bit input signals 115 held in the output buffer 165, new X-bit input signals may be received and buffered in the input buffer 160. After all bits of each input X-bit signal 115 have been read out from the output buffer 165 to the interface 135, the system 100 may begin performing the reordering scheme on the new X-bit input signals.

The system 100 may perform the recording scheme a number of times, such as until an entire frame of image data has been read out of the sensor 105. Alternatively, the system 100 may perform one reordering scheme for a predetermined region of interest of the image frame and a different reordering scheme for the image data outside of the region of interest.

In various embodiments, the bit subset may comprise one of a most significant bit (MSB) of the X-bit input signal 115 or a least significant bit (LSB) of the X-bit input signal 115. For example, the system 100 may operate in conjunction with a direct digital radiography (DDR) image sensor. A DDR image sensor may be used to produce DDR images having a plurality of X-bit pixels. Pixels that are adjacent to each other may have the same (or similar) binary values, meaning that the adjacent pixels have the same (or similar) most-significant-bit (MSB). Thus, performing the reordering scheme may comprise generating one or more output signals 125 where the MSBs of each pixel are arranged successively with respect to one another, thereby reducing the number of toggles between each X-bit input signal 115, i.e., each pixel. Similarly, performing the reordering scheme may also comprise generating one or more output signals 125 where the LSBs of each pixel are arranged successively with respect to one another.

As another example, the system 100 may operate in conjunction with an image sensor having a Bayer-filter which passes certain colors of light to selected pixel sensors. The pixels in a Bayer filter alternate between green and red or green and blue within a given line of pixels. Because physically proximate pixels of the same color will likely have the same (or similar) binary values, performing the reordering scheme reduces the number of toggles between each X-bit input signal 115, i.e., each pixel by reading out the most significant bits of all of the green pixels first and then reading out the most significant bits of all of the red pixels. In such a case, the control circuitry 140 may direct the output buffer 165 and the signal select control circuit 175 to read out the input signals in the order of sections 1, 3, 5, 7, 2, 4, 6, and 8 so that the green pixels are grouped together and read out sequentially and the red pixels are grouped together and read out sequentially.

In the foregoing specification, the technology has been described with reference to specific exemplary embodiments. The particular implementations shown and described are illustrative of the technology and its best mode and are not intended to otherwise limit the scope of the present technology in any way. The description and figures are illustrative, rather than restrictive, and modifications are intended to be included within the scope of the present technology. Accordingly, the scope of the technology should be determined by the generic embodiments described and their legal equivalents rather than by merely the specific examples described.

For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus, comprising:
    an input buffer configured to receive a plurality of X-bit input signals, wherein each X-bit input signal comprises a plurality of bit subsets;
    an output buffer configured to hold the plurality of X-bit input signals;
    a plurality of registers, wherein each register is configured to store a word, and wherein each word indicates a bit subset from the plurality of bit subsets;
    control circuitry having access to the plurality of registers and configured to:

control a state of the apparatus based on the word; and
transfer the X-bit input signals from the input buffer to the output buffer based on the state; and
a signal select control circuit in communication with the input buffer, the output buffer, and the control circuitry, wherein the signal select control circuit is configured to:
receive a select signal from the control circuitry, wherein the select signal is associated with the state of the apparatus and the word; and
read out, from the output buffer, the bit subset of each X-bit input signal according to the select signal.

2. The apparatus of claim 1, wherein the bit subset comprises one of a most significant bit (MSB) of the X-bit input signal or a least significant bit (LSB) of the X-bit input signal.

3. The apparatus of claim 1, wherein the state is one of a plurality of states, and wherein each state is independent from the other states and is associated with one register from the plurality of registers.

4. The apparatus of claim 1, wherein at least one of the plurality of registers (170) is a programmable register and is capable of storing a new word at a predetermined synchronization point.

5. The apparatus of claim 4, wherein the control circuitry comprises logic circuitry, and wherein the logic circuitry is configured to generate the new word.

6. The apparatus of claim 1, wherein the signal select control circuit comprises:
a plurality of input lines connected to the output buffer, wherein the plurality of input lines are configured to transmit the plurality of X-bit input signals from the output buffer to the signal select control circuit;
a plurality of select lines, wherein each select line is connected to one of the plurality of registers, and wherein each select line is configured to transmit the select signal for selecting one of the bit subsets; and
an output line configured to connect to an interface, wherein the output line is configured to transmit the bit subset from the output buffer to the interface.

7. A method for reordering signals that are generated by a sensor, comprising:
receiving, with an input buffer, a plurality of X-bit input signals;
buffering each X-bit input signal in the input buffer;
reading out each X-bit input signal to an output buffer based on a state of a state machine; and
reordering the X-bit input signals to generate a plurality of output signals, comprising:
buffering each X-bit input signal in the output buffer;
splitting each X-bit input signal into a plurality of bit subsets;
selecting, from each X-bit input signal, a bit subset from the plurality of bit subsets based on the state of the state machine; and
reading out, from the output buffer, the bit subset of each X-bit input signal based on the state of the state machine.

8. The method of claim 7, wherein the bit subset comprises one of a most significant bit (MSB) of the X-bit input signal or a least significant bit (LSB) of the X-bit input signal.

9. The method of claim 7, wherein the state is one of a plurality of states, and wherein each state is independent from the other states and is associated with one register from a plurality of registers.

10. The method of claim 9, further comprising storing a plurality of words in the plurality of registers, wherein each register is configured to store one of the plurality of words, and wherein each word indicates the bit subset from the plurality of bit subsets.

11. The method of claim 10, wherein generating the plurality of output signals comprises:
entering a first state from a waiting state in response to detecting the plurality of X-bit input signals being received by the input buffer;
after entering the first state:
reading out, from the input buffer to the output buffer, at least one of the plurality of X-bit input signals;
splitting the at least one X-bit input signal into the plurality of bit subsets;
selecting, from the plurality of bit subsets, the bit subset according to one of the plurality of words; and
reading out the bit subset from the output buffer to an interface; and
entering a plurality of subsequent states, wherein each subsequent state comprises:
reading out, from the input buffer to the output buffer, at least one of the plurality of X-bit input signals that was not read out in a previous state;
splitting the at least one X-bit input signal into the plurality of bit subsets;
selecting, from the plurality of bit subsets, the bit subset according to another one of the plurality of words;
reading out the bit subset from the output buffer to the interface; and
entering a next subsequent state if the number of X-bit input signals remaining to be read out of the input buffer exceeds zero.

12. The method of claim 11, further comprising entering the waiting state from one of the plurality of subsequent states if the number of X-bit input signals remaining to be read out of the input buffer is equal to zero.

13. The method of claim 10, wherein at least one of the plurality of registers is a programmable register and is capable of storing a new word at a predetermined synchronization point.

14. A system, comprising:
a sensor configured to generate a plurality of output signals from a plurality of X-bit input signals;
control circuitry having access to a plurality of words stored in a plurality of registers and configured to:
control a state of output circuitry based on one of the plurality of words; and
control signal transfer within the output circuitry; and
wherein the output circuitry comprises:
an input buffer configured to receive the plurality of X-bit input signals, wherein each X-bit input signal comprises a plurality of bit subsets;
an output buffer configured to hold the plurality of X-bit input signals;
the plurality of registers, wherein each register is configured to store one of the plurality of words, and wherein each word indicates a bit subset from the plurality of bit subsets; and
a signal select control circuit in communication with the input buffer, the output buffer, and the control circuitry, wherein the signal select control circuit is configured to:
receive a select signal from the control circuitry, wherein the select signal is associated with the state of the control circuitry and one of the plurality of words; and read out, from the output buffer, the bit subset of each X-bit input signal according to the select signal.

15. The system of claim 14, wherein the control circuitry is further configured to generate the select signal from one of the plurality of words.

16. The system of claim 14, wherein at least one of the plurality of registers is a programmable register and is capable of storing a new word at a predetermined synchronization point.

17. The system of claim 16, wherein the control circuitry comprises logic circuitry, and wherein the logic circuitry is configured to generate the new word.

18. The system of claim 14, wherein the signal select control circuit comprises:
   a plurality of input lines connected to the output buffer, wherein the plurality of input lines are configured to transmit the plurality of X-bit input signals from the output buffer to the signal select control circuit;
   a plurality of select lines, wherein each select line is connected to one of the plurality of registers, and wherein each select line is configured to transmit the select signal for selecting one of the bit subsets; and
   an output line configured to connect to an interface, wherein the output line is configured to transmit the bit subset from the output buffer to the interface.

19. The system of claim 14, wherein the control circuitry comprises a state machine responsive to a timer and sends the output circuitry into:
   a first state from a waiting state in response to detecting the plurality of X-bit input signals being received by the input buffer; and
   a plurality of subsequent states;
   wherein:
   if the first state is entered, the output circuitry is configured to:
      read out, from the input buffer to the output buffer, at least one of the plurality of X-bit input signals;
      split the at least one X-bit input signal into the plurality of bit subsets;
      select, from the plurality of bit subsets, the bit subset according to one of the plurality of words; and
      read out the bit subset from the output buffer to an interface; and
   if one of the plurality of subsequent states is entered, the output circuitry is further configured to:
      read out, from the input buffer to the output buffer, at least one of the plurality of X-bit input signals that was not read out in a previous state;
      split the at least one X-bit input signal into the plurality of bit subsets;
      select, from the plurality of bit subsets, the bit subset according to another one of the plurality of words;
      read out the bit subset from the output buffer to the interface; and
      enter a next subsequent state if the number of X-bit input signals remaining to be read out of the input buffer exceeds zero.

20. The system of claim 14, wherein the bit subset comprises one of a most significant bit (MSB) of the X-bit input signal or a least significant bit (LSB) of the X-bit input signal.

* * * * *